United States Patent
Pierson et al.

(10) Patent No.: US 6,579,802 B1
(45) Date of Patent: Jun. 17, 2003

(54) METHOD OF FORMING SMOOTH MORPHOLOGIES IN INP-BASED SEMICONDUCTORS

(75) Inventors: Thomas E. Pierson, Evanston, IL (US); Christopher T. Youtsey, Farmington Hills, MI (US)

(73) Assignee: LNL Technologies, Inc., Cambridge, MA (US)

( * ) Notice: Subject to any disclaimer, the term of this patent is extended or adjusted under 35 U.S.C. 154(b) by 0 days.

(21) Appl. No.: 09/672,411

(22) Filed: Sep. 28, 2000

Related U.S. Application Data

(60) Provisional application No. 60/156,667, filed on Sep. 29, 1999.

(51) Int. Cl.[7] .............................................. H01L 21/302
(52) U.S. Cl. ...................... 438/706; 438/707; 438/710; 438/711; 438/714
(58) Field of Search ................................. 438/706, 707, 438/710, 711, 712, 714

(56) References Cited

U.S. PATENT DOCUMENTS

| | | | |
|---|---|---|---|
| 5,607,542 A | * | 3/1997 | Wu et al. ................ 156/643.1 |
| 5,853,960 A | * | 12/1998 | Tran et al. ................... 430/321 |
| 6,074,888 A | * | 6/2000 | Tran et al. ..................... 438/39 |
| 6,324,316 B1 | * | 11/2001 | Fouquet et al. ............... 385/16 |

OTHER PUBLICATIONS

R.J. Shul, et al., Temperature Dependent Electron Cyclotron Resonance Etching of InP, GaP, and GaAs J. Vac. Sci. Technology A 14(3), May/Jun. 1996, pp. 1102–1105.

* cited by examiner

Primary Examiner—Matthew Smith
Assistant Examiner—Renzo N. Rocchegiani
(74) Attorney, Agent, or Firm—Edwards & Angell, LLP

(57) ABSTRACT

A semiconductor dry etching process that provides deep, smooth (RMS of less than approximately 5 nm), and vertical etching of InP-based materials with ICP RIE using a chlorinated plasma with the addition of hydrogen gas. Inert gases such as nitrogen, argon, or both may also be included. To produce relatively high anisotropy with exceptionally smooth surfaces, the amount of hydrogen gas added preferably exceeds the volumetric measure of chlorinated gas in standard cubic centimeter per minute (sccm); at a ratio of greater than 1:1. The present invention provides an improved dry etching process for InP-based semiconductor materials that yields deep, vertical etch profiles with improved surface smoothness (i.e., morphology) and high manufacturing etch rates.

6 Claims, 3 Drawing Sheets

| Example | #1 | #2 | #3 | #4 |
|---|---|---|---|---|
| ICP Power (W) | 500 | 275 | 200 | 200 |
| Electrode Power (w) | 150 | 105 | 100 | 100 |
| Resultant DC Bias (v) | 283 | 297 | 291 | 300 |
| Temperature (°C) | 250 | 300 | 275 | 250 |
| Pressure (mT) | 2.2 | 2.4 | 1.6 | 2 |
| Chlorine Flow (sccm) | 14 | 14 | 9 | 12 |
| Hydrogen Flow (sccm) | 24 | 24 | 10 | 15 |
| Argon Flow (sccm) | 10 | 10 | 10 | 10 |
| Etch Rate (nm/min) | 769 | 388 | 617 | 650 |
| Selectivity Over Oxide Mask | 6 | 10 | 15 | 15 |

METHOD OF FORMING SMOOTH MORPHOLOGIES IN INP-BASED SEMICONDUCTORS

CROSS-REFERENCE TO RELATED APPLICATIONS

This application claims priority to Provisional Patent Application Ser. No. 60/156,667, filed on Sep. 29, 1999.

FIELD OF THE INVENTION

The present invention is directed to an improved method of forming smooth morphologies in InP-based semiconductors.

BACKGROUND OF THE INVENTION

In the fabrication of nano-scale semiconductor structures, etching is critical. For nano-scale opto-electric and optical devices, surface morphology (i.e., smoothness or lack thereof) determines, at least in part, the performance characteristics of the device; smoother surfaces minimizing optical scattering losses and improving the optical performance of the device. High selectivity (i.e., the difference in etch rate between the substrate and the masking material (how deep a semiconductor may be etched without also etching away the mask)), minimal undercut (i.e., anisotropic etching), and high throughput may all be achieved with high-density-plasma etching, a technique in which an electric field causes energetic ions to strike the surface of a semiconductor substrate at an angle perpendicular to the substrate surface Unfortunately, etching processes that produce desired characteristics (i.e., surface smoothness, verticality, etc.) for certain types of semiconductors do not necessarily produce desired characteristics for all or different semiconductors. Thus, well known and relatively mature etching processes used to etch silicon (Si) or gallium arsenide (GaAs), for example, do not yield the same results when used to etch indium phosphide (InP). This is because different semiconductors necessitate different etching chemistries to react with the substrate atoms and are thus subject to different processing issues. For example, difficulties arise in obtaining smooth-etched surfaces in InP-based semiconductors using chlorine-based chemistry etching due to the differing volatilities in the $InCl_x$ and the $PCl_x$ and their corresponding different removal rates during etching. Consequently, an etched surface may be either In-rich or P-rich and thus exhibit rough surface morphology. One solution has been to use methane/hydrogen chemistries, which have been shown to produce relatively smooth InP surfaces, but at very slow etch rates, e.g., approximately 100 nm/minute. Also, $CH_4$/$H_2$ processes lead to the deposition of polymers that can adversely alter the chamber conditions and thus affect process reproducibility.

The inductively coupled plasma reactive ion etching (ICP RIE) process is a relatively new dry etching technique developed during the 1990s. The principle advantage of ICP RIE, when compared with other RIE techniques, is the ability to independently control ion energy and flux density. That control, together with proper etch chemistry, can yield improved dry etching processes for InP-based semiconductors.

There thus exists a need in the art for a semiconductor etching process that overcomes the above-described shortcomings of the prior art.

SUMMARY OF THE INVENTION

The present invention is directed to a semiconductor dry etching process that provides deep, smooth, and vertical etching of InP-based materials with ICP RIE using a chlorinated plasma with the addition of hydrogen gas. To produce relatively high anisotropy with exceptionally smooth surfaces, the amount of hydrogen gas added preferably exceeds the volumetric measure of chlorinated gas in standard cubic centimeter per minute (sccm); at a ratio of greater than 1:1.

In an embodiment of the present invention, hydrogen is added to a chlorinated (i.e., $Cl_2$-based, $BCL_3$-based, $SiCL_4$-based, etc.) ICP RIE process. The added hydrogen reacts with phosphorous to form $PH_3$ products. To produce smooth etched surfaces in InP-based semiconductors, the amount of hydrogen gas added must exceed the volumetric measure of chlorinated gas in sccm. Preferably, the flow rate ratio of hydrogen gas to chlorinated gas is greater than 1:1, and most preferably, the ratio is approximately 5:3 when pure-$Cl_2$ gas is used.

The inventive process provides an improved dry etching process (e.g., ICP RIE) for InP-based semiconductor materials that yields significantly improved surface smoothness (i.e., morphology), trench depths as deep as 6 μm, and manufacturing etch rates of up to 1 μm per minute.

In a preferred embodiment, the present invention is directed to a process for etching InP-based semiconductor materials using the ICP RIE technique. The ICP RIE system has a first RF generator connected to an inductive coil capable of transforming power into a gaseous medium to generate an ionized discharge (i.e. plasma). A second RF generator is used to create an electric field across the plasma and is connected to a platen that supports an InP semiconductor sample inside the chamber of the ICP RIE system and within which the process is carried-out. The inventive process comprises heating the platen to a temperature of between approximately 130° and 400° C. Reactive source gases are introduced into the chamber having a chlorine part and a hydrogen part at a higher volumetric measure (i.e., flow rate) than the chlorine part, preferably at a flow rate ratio of greater than 1:1. The pressure within the chamber is set to less than approximately 5 mT. The power of the first RF generator is set to between approximately 200 and 700 W (3000 W full scale) to provide a relatively low flux of incident ions so that a high selectivity over the etch mask (typically oxide or nitride) can be achieved. The power of the second RF generator is set to between approximately 80 and 200 W to control the DC bias (>250 V) through which the incident ions of the plasma gas are accelerated. The plasma ions are accelerated normal to the plane of the InP semiconductor surface and the substrate is etched at a rate of between approximately 0.38 and 1 μm per minute.

The invention accordingly comprises the features of construction, combination of elements, and arrangement of parts which will be exemplified in the disclosure herein, and the scope of the invention will be indicated in the claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

The present invention is directed to a semiconductor dry etching process that provides deep, smooth, and vertical etching of InP-based materials with ICP RIE using a chlorinated plasma with the addition of hydrogen gas. Chlorine-ions may be generated from a number of gas sources, i.e. $Cl_2$ gas, $BCl_3$ gas, $SiCl_4$ gas, etc. To produce high anisotropy with exceptionally smooth surfaces, the amount of hydrogen gas added preferably exceeds the volumetric measure of chlorinated gas in standard cubic centimeter per minute (sccm); at a ratio of greater than 1:1.

Applicants have discovered an etching process for InP-based materials where the addition of hydrogen gas in an amount greater (in sccm, for example) than the amount of chlorinated gas can be applied to yield high anisotropy with exceptionally smooth, vertical surfaces (i.e., sidewalls), at etch depths up to 6 µm and at etch rates up to 1 µm per minute. Thus, InP-based optical devices may be made with high throughput using the present invention, and will exhibit improved optical properties due to the exceptionally smooth vertical surfaces.

Figure 1:
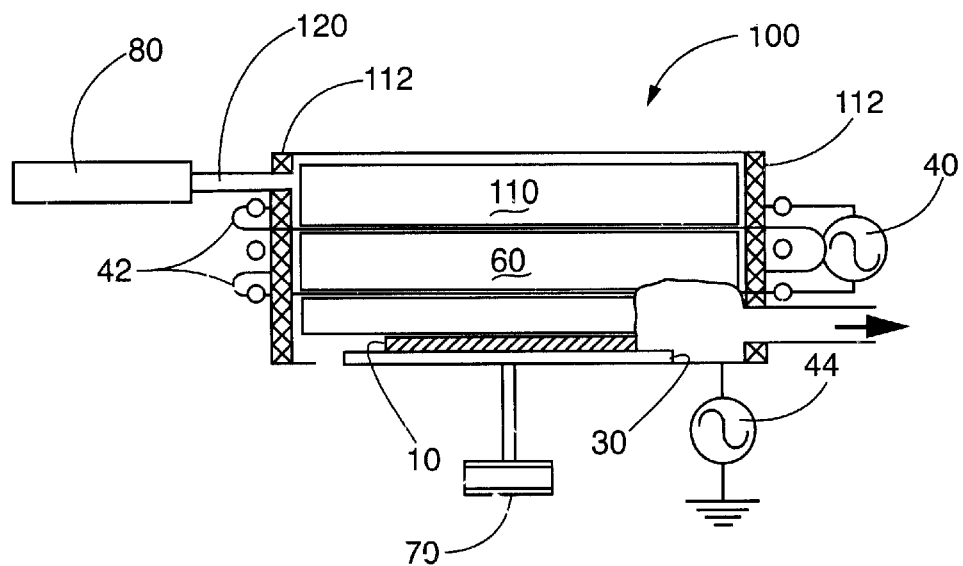
FIG. 1 is a schematic diagram of the etching chamber and various other components of an ICP RIE system.

The present invention may be carried out using an Inductively Coupled Plasma Reactive Ion Etching (ICP RIE) system, a part of which is generally designated by reference numeral 100 in FIG. 1. The ICP RIE system 100 may include parts and components in addition to those depicted in FIG. 1 (e.g., loadlock, robotics, etc.), as will be obvious to persons skilled in the art. For purposes of the present invention, the chamber 110 of the ICP RIE system 100 is the part of the system 100 within which the present invention is carried-out.

Precise amounts of each process gas (measured in standard cubic centimeters per minute (sccm)) are delivered into the chamber from a number of mass flow controllers (MFCs), designated generally as 80, through a gas source feed tube 120. Process gases may include chlorinated gas (i.e. $Cl_2$, $BCL_3$, $SiCl_4$, etc.) and hydrogen gas, and may also include inert gases such as argon and/or nitrogen. These gases may be introduced into the process chamber 110 in various percentages (in sccm, for example), as discussed in more detail below.

Within the chamber 110 a 2 MHz RF generator or power supply 40 is used to generate a plasma discharge 60 by applying RF power into an inductive coil 42. The power supply 40 and coil 42 configuration couples RF power into the gaseous medium (i.e., the mixture of process gases) within the chamber 110 causing ionizations and the resultant plasma density of the gaseous medium is determined by the amount of RF power supplied by the power supply 40.

The RF power supply 40 and inductive coil 42, which proximately surrounds the gaseous medium within the chamber 110, couple RF power into the gaseous medium to generate a plasma 60 (i.e. ionized gas). The power supply 40 may be used to control the plasma density and thus the ion flux (i.e., number of incident ions per unit area) during the etch process. When a dielectric etch mask is used (i.e. $SiO_2$ or $SiN_x$), deep etching of InP-based semiconductors requires a relatively low flux of incident ions to minimize the degradation of the etch mask (i.e. increase selectivity). Preferably, when a dielectric etch mask is used the output power of the first RF power supply 40 is set to between approximately 200 and 700 watts, with a full-scale power of approximately 3000 watts. A 13.56 MHz RF generator or source 44 is connected to a platen 30 that serves as a cathode for the system 100 while the chamber walls 112 serve as an anode for the system 100. The platen (i.e., powered cathode) 30 creates an electric field which accelerates the positive-charged plasma ions towards the platen 30. Consequently, an InP-based substrate (i.e.,. sample or wafer) 10 placed on the platen 30 is bombarded with ions. The RF generator 44 controls the bias through which the ions are accelerated (i.e. ion energies). The output power of that RF generator 44 is set to between approximately 80 and 200 watts (full-scale power of approximately 500 watts) so as to achieve ion energies in the range of approximately 250 and 515 eV.

As is generally known, the wafer 10 may be fabricated using various semiconductor deposition techniques and methods, and may comprise various layers of semiconductor material. In accordance with the present invention, the wafer 10 is comprised of InP-based semiconductors (e.g., InP, InGaAs, InGaAsP). A dielectric material such as $SiO_2$ or $SiN_x$ is grown atop of the wafer 10 top surface and patterned using standard semiconductor lithographic techniques. The patterned dielectric material then serves as a mask for etching into the semiconductor material. The wafer 10 is clamped to the platen 30 and the platen 30 is be heated by a thermocouple 70, to a temperature of between 130° and 400° C. Heating the platen 30 will cause the temperature of the wafer 10 to also increase.

The pressure within the chamber 110 is preferably set to less than 5 mT, using pressure controls provided as part of the ICP RIE system 100.

The procedure for positioning a sample 10 and carrying out the method (process) of the present will now be described in detail and with continued reference to FIG. 1. As is generally known, ICP RIE systems 100 typically include a control panel (not shown) which enables setting and control of the various parameters within the chamber 110 such as, for example, chamber pressure, platen temperature, RF generator power, gas mixture for the plasma gas, and other parameters. Thus, while the following description may not include every step necessary to etch an InP wafer 10 in an ICP RIE system 100, it does include the steps essential to the present invention.

The platen 30 temperature is set by setting the thermocouple 70 control to a desired temperature. In accordance with the present invention, that temperature is between approximately 130° and 400° C. Outside of the chamber 110 (and, indeed, outside of the system 100), the InP-based sample 10 is mounted to a semi-insulating 3-inch diameter Si wafer (R>5000 Ω/cm$^{-1}$) (not shown) with Thermalcote II brand thermal paste (not shown). The sample 10 is then gently blown with $N_2$ gas. The semi-insulating wafer and sample wafer 10 are placed in a loadlock (not shown) and moved into the chamber 110 by robotics or other automated means provided as part of the system 100. When bulk-processing 2"-diameter (or larger) InP-based wafers, the wafer need not be mounted to a semi-insulating Si carrier wafer but can be directly transferred into the system chamber and clamped to the platen.

Process parameters may then be input to the system 100 via an input device such as a keypad or other data entry device (not shown). Exemplary parameters are provided in FIG. 3 and discussed in more detail below.

Figures 3, 4:
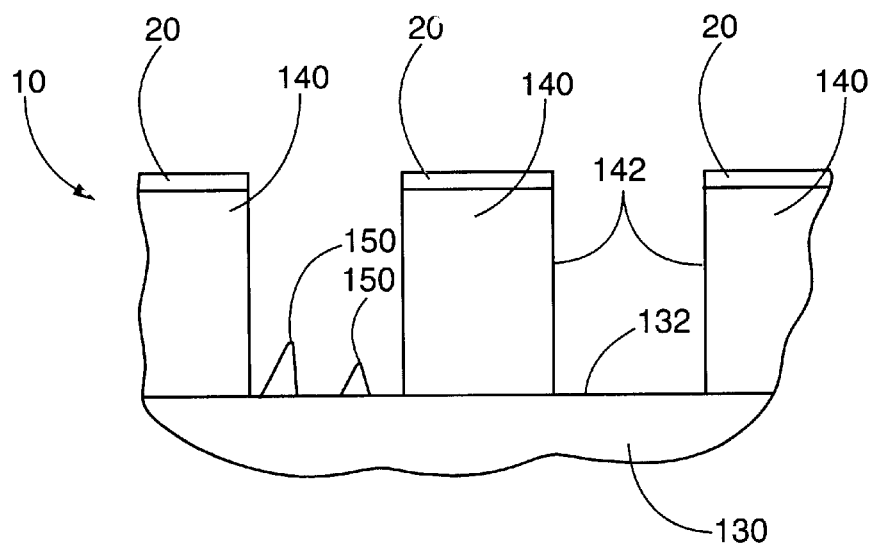
FIG. 3 is a table of parameters for the ICP RIE system when etching InP-based semiconductors using the process of the present invention.
FIG. 4 is a cross-sectional schematic of an InP-based semiconductor wafer having a waveguide formed thereon.

The present invention was verified by a series of experiments in which the H$_2$/Cl$_2$ gas flow ratio, and other parameters, were varied. With reference to FIG. 3, example 1 was conducted by setting the power of the first RF generator 40 to 500 W, and the power of the second generator 44 to 150 W. The power supply settings provided a DC bias for the plasma gas 60 of approximately 283 V. The temperature of the platen 30 was set to approximately 250° C., and the pressure within the chamber 110 set to 2.2 mT. The ratio of hydrogen to chlorine was 24:14 (12:7) (in sccm), and argon was added to the plasma gas 60 at a rate of 10 sccm. Those parameters yielded an etch rate of 0.769 µm per minute and selectively over the silicon dioxide mask of 6.

Example 2 was conducted by setting the power of the first RF generator 40 to 275 W, and the power of the second generator 44 to 105 W. These settings provided a DC bias for the plasma gas 60 of approximately 297 V. The temperature of the platen 30 was set to approximately 300° C., and the pressure within the chamber 110 set to 2.4 mT. The ratio of hydrogen to chlorine was 24:14 (12:7) (in sccm), and argon was added to the plasma gas 60 at a rate of 10 sccm. Those parameters yielded an etch rate of 0.388 µm per minute and selectively over the silicon dioxide mask of 10.

Example 3 was conducted by setting the power of the first RF generator 40 to 200 W, and the power of the second generator 44 to 100 W. These settings provided a DC bias for the plasma gas 60 of approximately 291 V. The temperature of the platen 30 was set to approximately 275° C., and the pressure within the chamber 110 set to 1.6 mT. The ratio of hydrogen to chlorine was 10:9 (in sccm), and argon was added to the plasma gas 60 at a rate of 10 sccm. Those parameters yielded an etch rate of 0.617 µm per minute and selectively over the silicon dioxide mask of 15.

Example 4 was conducted by setting the power of the first RF generator 40 to 200 W, and the power of the second generator 44 to 100 W. These settings provided a DC bias for the plasma gas 60 of approximately 300 V. The temperature of the platen 30 was set to approximately 250° C., and the pressure within the chamber 110 set to 2 mT. The ratio of hydrogen to chlorine was 15:12 (5:4) (in sccm), and argon was added to the plasma gas 60 at a rate of 10 sccm. Those parameters yielded an etch rate of 0.650 µm per minute and selectively over the silicon dioxide mask of 15.

An etched InP-based wafer 10 is depicted in FIG. 4. That wafer 10 includes an InP substrate 130, and a plurality of waveguides 140 etched in accordance with the present invention or using other known semiconductor etching processes or techniques. A mask 20 defines the etch pattern, as is generally known in the art. It is desirable to etch the wafer 10 so that the sidewalls 142 of the waveguide 140 are as smooth as possible. It is also desirable to eliminate the formation of sporadic cones 150 on the substrate floor 132, which also adversely affect the optical characteristics of the wafer 10 and any optical device made therefrom.

Figure 2:
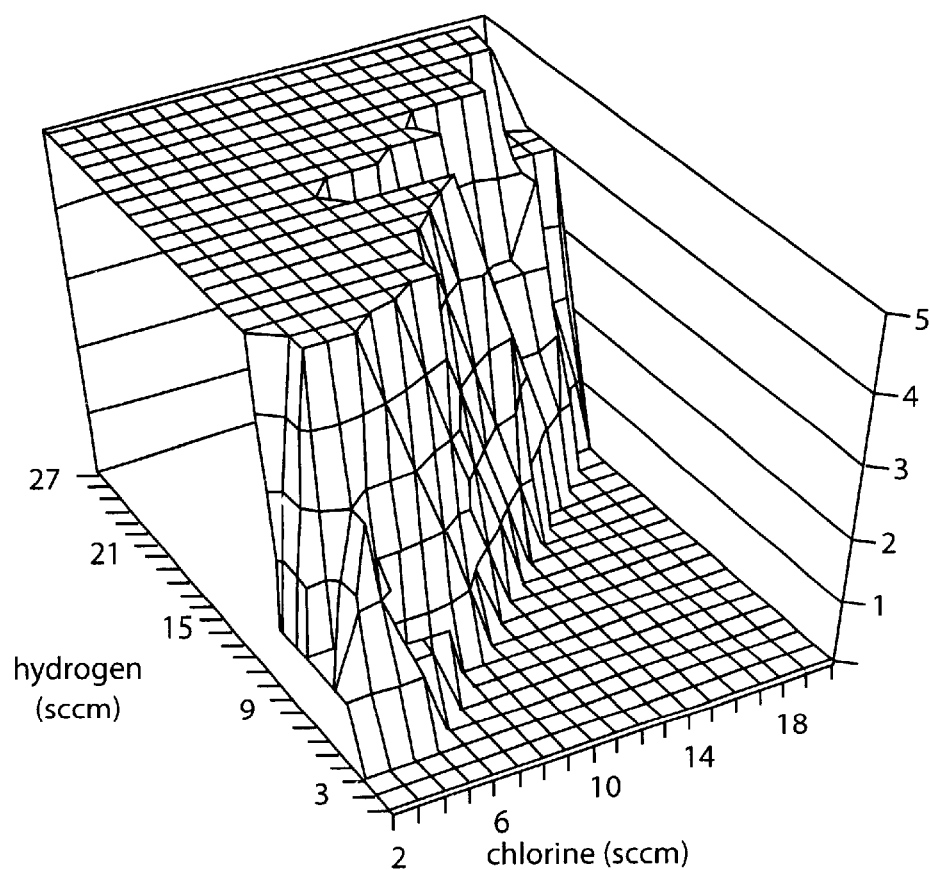
FIG. 2 is a graph depicting a surface response analysis (SRA) of an etched InP surface morphology as a function of chlorine and hydrogen gas flow rates.

The improved surface morphology (i.e., smoothness) is apparent from the surface response analysis depicted in FIG. 2 that indicates the surface smoothness possible with the present invention. In that figure, etched surfaces are rated between 0 and 5, with extremely smooth surfaces being rated 5. Surfaces that are very smooth but occasionally exhibit sporadic cone formations 150 (see, e.g., FIG. 4) on the substrate floor 132 are rated 4, while smooth surfaces that consistently show sporadic cone formations 150 on the substrate floor 132 are rated 3. Surfaces rated 1 and 2 may have dense cone formations, and 0 rated surfaces have very rough morphologies. Thus, by providing a volumetric flow of hydrogen gas greater than the volumetric flow of chlorinated gas, 4 or 5 rated surfaces may be achieved. In addition, with proper selection and control of the other etching parameters (e.g., RF generator voltage, temperature, pressure), increased etch rates and deeper etch depths may be obtained without sacrifice to the superior surface morphology provided by the present invention.

Figure 5:
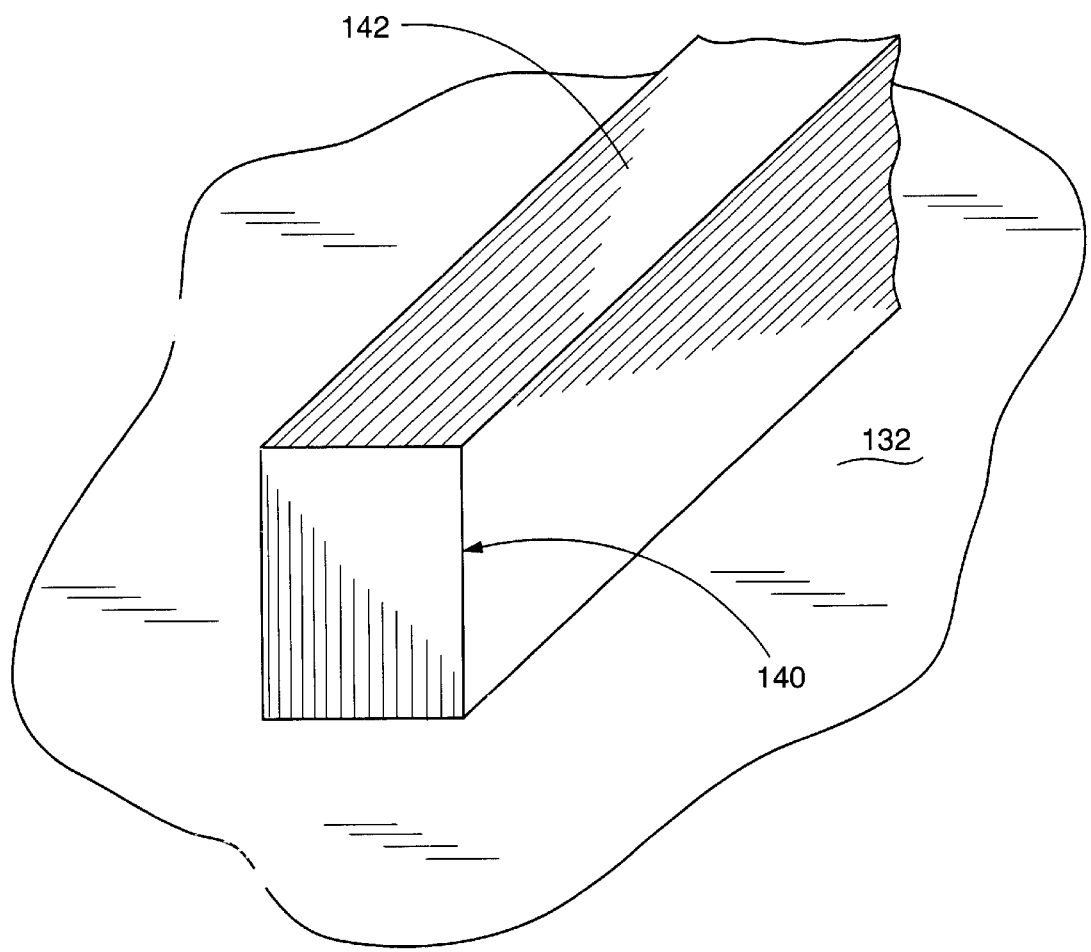
FIG. 5 is a Scanning Electron Microscope (SEM) image of an InP/InGaAsP waveguide etched to a depth of approximately 2.6 µm using ICP RIE with a $Cl_2/H_2/N_2/Ar$ plasma.

The improved surface morphology provided by the present invention is further apparent from the SEM image of FIG. 5. That figure shows an InP/InGaAsP waveguide 140 etched to a depth of approximately 2.6 µm using a Cl$_2$/H$_2$/N$_2$/Ar plasma. The root-mean-square (RMS) roughness of the sidewalls 142 and floor 132 is less than approximately 5 nm.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

It will thus be seen that the objects set forth above, among those made apparent from the preceding description, are efficiently attained and, since certain changes may be made in the above construction without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A process for etching a feature having a sidewall and a floor in an InP-based semiconductor sample using an ICP RIE system having a first RF generator to control a plasma density of a plasma, a second RF generator to control ion energies of the plasma, and a platen for supporting the InP-based semiconductor sample inside a chamber of the ICP RIE system and within which said process is carried-out, said process comprising the steps of:

(a) placing the sample on the platen;

(b) heating the platen to a temperature of between approximately 130° and 400° C.;

(c) introducing reactive source gases into the chamber, said reactive source gases having a hydrogen part and a chlorine part at a volumetric flow rate ratio of said hydrogen part and said chlorine part of greater than 1:1;

(d) providing a pressure within the chamber of less than approximately 5 mT;

(e) setting the power of the first RF generator to between approximately 200 and 700 watts to generate a plasma discharge and provide a relatively low flux of incident ions in the plasma;

(f) setting the power of the second RF generator to between approximately 80 and 200 watts to create an electric field across the plasma and control the bias through which plasma ions are accelerated;

(g) etching the feature in the InP-based sample by bombardment with accelerated plasma ions at an etch rate of between approximately 0.38 and 1 μm per minute, the sidewall of the etched feature having a root-mean-square roughness of less than approximately 5 nm.

2. A process as recited in claim 1, wherein the ratio of the hydrogen part to the chlorine part approximately 5:3.

3. A process as recited in claim 1, wherein the platen is heated to a temperature of approximately 250° C., the ratio of the hydrogen part to the chlorine part is approximately 12:7, the chamber pressure is approximately 2.2 mT, the power of the first generator is set to approximately 500 watts, the power of the second generator is set to approximately 150 watts, and the etch rate is approximately 0.769 μm per minute.

4. A process as recited in claim 1, wherein the platen is heated to a temperature of approximately 300° C., the ratio of the hydrogen part to the chlorine part is approximately 12:7, the chamber pressure is approximately 2.4 mT, the power of the first generator is set to approximately 275 watts, the power of the second generator is set to approximately 105 watts, and the etch rate is approximately 0.388 μm per minute.

5. A process as recited in claim 1, wherein the platen is heated to a temperature of approximately 275° C., the ratio of the hydrogen part to the chlorine part is approximately 10:9, the chamber pressure is approximately 1.6 mT, the power of the first generator is set to approximately 200 watts, the power of the second generator is set to approximately 100 watts, and the etch rate is approximately 0.617 μm per minute.

6. A process as recited in claim 1, wherein the platen is heated to a temperature of approximately 250° C., the ratio of the hydrogen part to the chlorine part is approximately 5:4, the chamber pressure is approximately 2 mT, the power of the first generator is set to approximately 200 watts, the power of the second generator is set to approximately 100 watts, and the etch rate is approximately 0.650 μm per minute.

* * * * *